United States Patent
Huang et al.

(10) Patent No.: US 11,042,148 B2
(45) Date of Patent: Jun. 22, 2021

(54) SYSTEM AND METHOD FOR SCHEDULING SEMICONDUCTOR LOT TO FABRICATION TOOL

(71) Applicant: Taiwan Semiconductor Manufacturing Co., Ltd., Hsinchu (TW)

(72) Inventors: Lin-Kai Huang, Hsinchu (TW); Wei-Chi Su, Hsinchu (TW); Yi-Ching Liu, New Taipei (TW); Cheng-Hsuan Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 254 days.

(21) Appl. No.: 15/992,207

(22) Filed: May 30, 2018

(65) Prior Publication Data

US 2019/0155260 A1 May 23, 2019

Related U.S. Application Data

(60) Provisional application No. 62/590,269, filed on Nov. 23, 2017.

(51) Int. Cl.
*G05B 19/418* (2006.01)
*H01L 21/67* (2006.01)
*H01L 21/66* (2006.01)

(52) U.S. Cl.
CPC .... *G05B 19/4187* (2013.01); *H01L 21/67253* (2013.01); *H01L 22/20* (2013.01);
(Continued)

(58) Field of Classification Search
CPC ..... G05B 19/4187; H01L 22/20; H01L 22/22; H01L 22/26; H01L 21/67276; H01L 22/12
(Continued)

(56) References Cited

U.S. PATENT DOCUMENTS 6,360,133 B1 * 3/2002 Campbell ........ G05B 19/41865
700/115
6,947,803 B1 * 9/2005 Bode ................. H01L 21/67253
438/5
(Continued)

FOREIGN PATENT DOCUMENTS

CN 100380261 4/2008
TW 200805542 1/2008
(Continued)

OTHER PUBLICATIONS

"Office Action of Taiwan Counterpart Application," dated Dec. 5, 2019, p. 1-p. 7.

*Primary Examiner* — Rocio Del Mar Perez-Velez
*Assistant Examiner* — Christopher W Carter
(74) *Attorney, Agent, or Firm* — JCIPRNET

(57) ABSTRACT

In the disclosure, a scheduled route of a lot may be rescheduled to another fabrication tool performing the same fabrication processes as to expand the production line and throughput. The controlling method includes at least the following steps. The lot is scheduled with a predetermined route having a plurality of fabrication tools configured to process the lot with a plurality of fabrication processes in a sequence. The lot is monitored as the lot is being processed by the fabrication tools in each of the fabrication processes, and inspection data is generated for each fabrication process. The lot is rescheduled to another fabrication tool outside of the predetermined route for one of the fabrication processes according to a release rule and the inspection data.

20 Claims, 5 Drawing Sheets

(52) U.S. Cl.
CPC .............. *H01L 22/22* (2013.01); *H01L 22/26* (2013.01); *H01L 21/67276* (2013.01); *H01L 22/12* (2013.01)

(58) Field of Classification Search
USPC ......................................................... 700/100
See application file for complete search history.

(56) References Cited

U.S. PATENT DOCUMENTS

| | | | | |
|---|---|---|---|---|
| 2005/0038543 | A1* | 2/2005 | Lin .................. | G05B 19/41865 |
| | | | | 700/108 |
| 2009/0319074 | A1* | 12/2009 | Wong ...................... | H01L 22/20 |
| | | | | 700/112 |
| 2016/0026177 | A1* | 1/2016 | Lam ................... | G05B 19/4187 |
| | | | | 700/109 |

FOREIGN PATENT DOCUMENTS

| | | |
|---|---|---|
| TW | 200818246 | 4/2008 |
| TW | 200951652 | 12/2009 |
| TW | I350489 | 10/2011 |

\* cited by examiner

SYSTEM AND METHOD FOR SCHEDULING SEMICONDUCTOR LOT TO FABRICATION TOOL

CROSS-REFERENCE TO RELATED APPLICATION

This application claims the priority benefit of U.S. provisional application Ser. No. 62/590,269, filed on Nov. 23, 2017. The entirety of the above-mentioned patent application is hereby incorporated by reference herein and made a part of this specification.

BACKGROUND

In semiconductor fabrication process(es), integrated circuit (IC) devices are formed in multiple-step sequence of a wide variety of processing and measuring fabrication tools and techniques in several manufacturing stages. One of more manufacturing stages may be performed by a fabrication tool (also be referred to as semiconductor-manufacturing equipment), where a wafer lot (a batch of wafers) is being transferred from one fabrication tool to the next fabrication tool.

In some cases, particular fabrication tools may be selected or assigned for processing a particular product. The selection may be based on the capability of the fabrication tools, demands of the customer, etc. However, in some cases, the number of the selected fabrication tools is limited on the shop floor. Thus, it is desired to expand the productivity and/or flexibility of the production line. For example, other (non-selected) fabrication tools in the shop may be considered and utilized. It is an ongoing development as to improve the management of the fabrication processes and/or fabrication tools.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
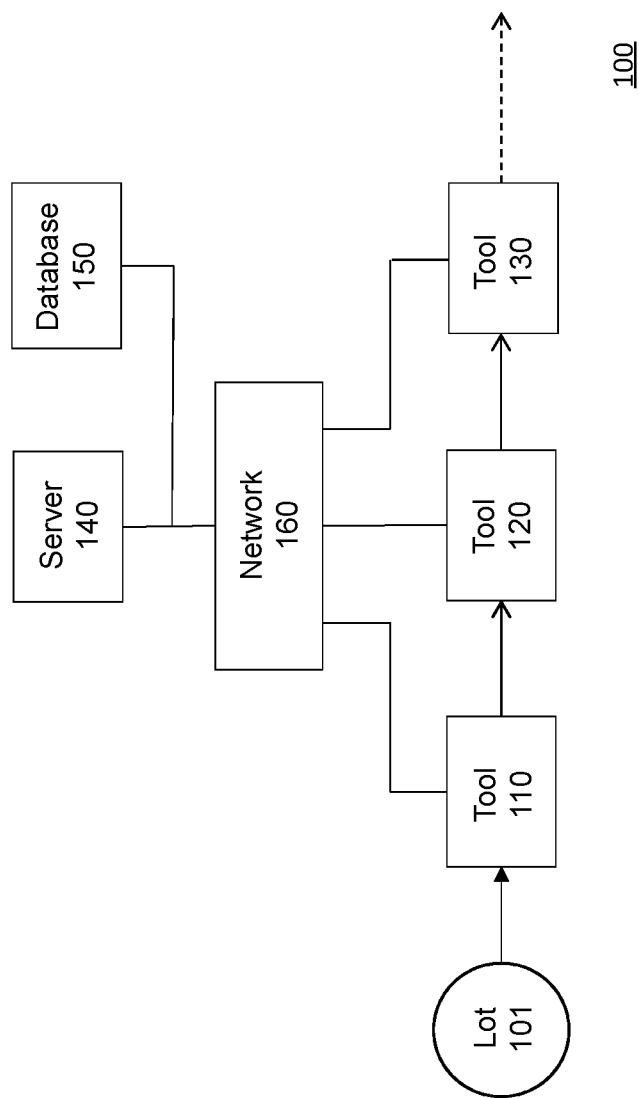
FIG. 1 is a block diagram illustrating a semiconductor fabrication system according to some exemplary embodiments of the disclosure.

In the following, various embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Exemplary embodiments of the present disclosure may comprise any one or more of the novel features described herein, including in the Detailed Description, and/or shown in the drawings. As used herein, "at least one," "one or more" and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more" and "at least one" can be used interchangeably herein.

The terms used in this specification generally have their ordinary meanings in the art and in the specific context where each term is used. The use of examples in this specification including examples of any terms discussed herein, is illustrative only, and in no way limits the scope and meaning of the disclosure or of any exemplified term. Likewise, the present disclosure is not limited to various embodiments given in this specification.

Semiconductor fabrication involves performing a relatively large number of process steps on a wafer in order to produce a desired semiconductor integrated circuit (IC). The wafers are stored in containers loaded in carriers, such as standard mechanical interfaces (SMIF) or front opening unified pods (FOUP) for transport throughout the foundry. The fabrication process is a multiple step sequence of photolithographic and chemical-processing steps during which electric circuits are gradually created on a wafer composed of a semiconductor material.

The various processing steps fall into a number of categories including deposition, removal patterning, chemical vapor deposition (CVD), electrochemical deposition (ECD), molecular beam epitaxy (MBE) atomic layer deposition (ALD) and the like. Removal is a process that removes material from the wafer in bulk or selectively and includes etching processes. For example, chemical mechanical planarization (CMP) is a typical removal process used between levels of a device. Patterning processes are those that shape or later the shape of deposited materials. Patterning is also referred to as lithography. A typical patterning process includes using a photoresist material to selectively mask portions of the semiconductor device, exposing the device to a particular wavelength of light, and then washing away the unexposed regions with a developer solution. Electrical properties are altered by doping selected regions by diffusion and/or ion implantation. The processes are typically followed by an anneal process, such as a furnace anneal or rapid thermal anneal (RTA) in order to activate the implanted dopants.

In the fabrication facility (fab), various fabrication tools (semiconductor-manufacturing equipments) are designed to perform the above processes respectively. A batch of wafers, also referred to as lot, are transferred from one fabrication tool to another fabrication tool. In at least one embodiment, the lot is received from a load port, which includes a platform arranged to a door of a processing module. Each lot may be processed through various fabrication stages (which may be hundreds of different stages) to form the desired IC. For example, a lot may be transferred to a deposition fabrication tool, a planarization fabrication tool, a photolithography fabrication tool, and an etching fabrication tool in a sequence. Each of these fabrication tools may include a computer and various electronic components to control the process of the fabrication tool. The computer includes at least a processor, a memory device and a network interface. The memory device stores a plurality of program codes which may be loaded and executed by the processor. The network interface is configured to connect to a network, where the computer may be coupled to another computer of other fabrication tool and/or a server through a network.

In the fabrication facility, fabrication tools that performs the same type of fabrication process but different models or produced by different manufactures may be accessible for performing a stage of fabrication process on the lot. In reality, fabrication tools are rated to hold certain tolerances or with certain capabilities. Some model of fabrication tool may have better performance than another and produces better yield as compared to others performing the same fabrication process. Therefore, routes may be designed or planned for the lot according to the design requirement for the product (lot).

FIG. 1 is a block diagram illustrating a semiconductor fabrication system 100 according to some exemplary embodiments of the disclosure. In the fabrication facility, there may be a plurality of fabrication tools 110, 120, 130 coupled to a server 140 and a database 150 through a network 160. The network 160 may be the internet or an intranet implementing network protocols such as transmission control protocol (TCP). The fabrication tools 110, 120, 130 may be fabrication tools that performs any of the above fabrication processes on a lot 101. The exemplary embodiments are for the purpose of the illustration, and it is not intended to limit the type of the fabrication tools or the sequence of the processes. Through the network 160, each fabrication tool 110, 120, 130 may download or upload work in progress (WIP) information regarding to the lot or the fabrication tool from or to, for example, to the server 140 or the database 150, where the WIP information may include a statistical process control (SPC) chart.

In semiconductor fabrication, each and every process performed on the wafer is monitored to ensure quality. The wafer may be inspected after each process. For example, wafer or layer thickness may be measured after a CMP process, overlay (OVL) and critical dimension (CD) may be measured after a photolithography process, etc. The measurements may be uploaded to the server or database and recorded in the SPC chart. The SPC chart collects information regarding the WIP such as measurements from each stage during control wafer processing and is used to monitor performance. The SPC chart is used to ensure that production fabrication tools are within performance expectations or the product is within a tolerance. In some exemplary embodiments, SPC chart may record the measurements such as CMP thickness, critical dimension or alignment overlay in photolithography, etc. Other tolerances or measurements throughout the semiconductor fabrication may also be collected and used for monitor the production without departing from the spirit and scope of the disclosure.

Figure 2:
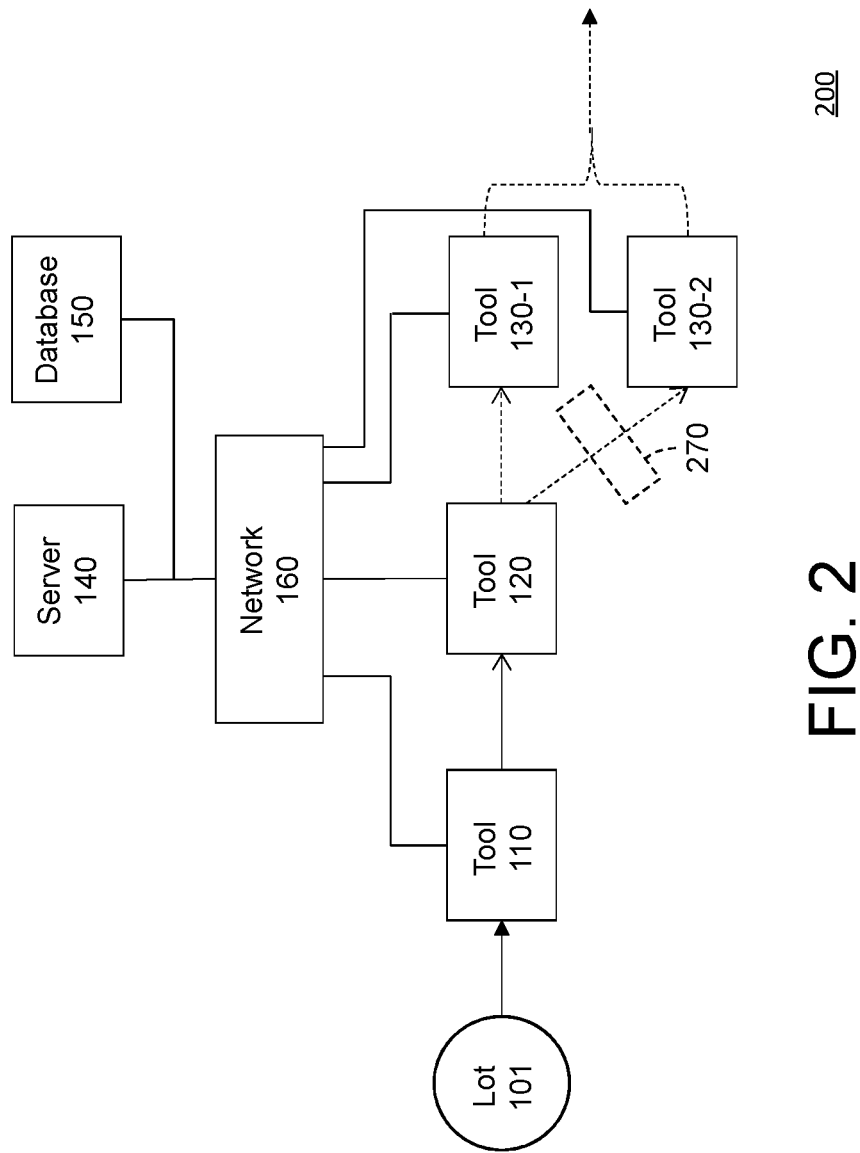
FIG. 2 is a block diagram illustrating a semiconductor fabrication system according to some of the exemplary embodiments of the disclosure.

FIG. 2 is a block diagram illustrating a system 200 according to some of the exemplary embodiments of the disclosure. The system 200 includes a plurality of fabrication tools 110, 120, 130-1, 130-2 coupled a server 140 and a database 150 through a network 160. In the exemplary embodiments, the fabrication tools 130-1, 130-2 are fabrication tools that performs the same fabrication process but having different performance. For example, the first fabrication tool 130-1 may be manufactured by different maker that has a better performance than another fabrication tool, i.e., the second fabrication tool 130-2. Alternatively, the first fabrication tool 130-1 may be a newer model that has similar performance as compared to the second fabrication tool 130-2. The difference in the performance of the fabrication tools may be induced by other parameters or variables of the fabrication tool itself, the exemplary embodiments is not intended to limit the present disclosure. Although FIG. 2 does not show any other fabrication tools between the fabrication tools 110, 120, 130-1, 130-2, the exemplary embodiment is not intended to limit the thereto. In other exemplary embodiments, various fabrication tools may be scheduled between the fabrication tools 110, 120, 130-1, 130-2 for processing the lot 101 according to the design requirement.

In the exemplary embodiments, a lot 101 is transferred to the fabrication tool 110 to start a sequence of different processes. The lot 101 may be processed by various stages forming at least one layer of material. The exemplary embodiments are not intended to limit the progress of the lot 101. In other exemplary embodiments, the lot 101 may include various layers, or any stages between the beginning and the completion of a product, before the lot 101 is transferred to the fabrication tool 110.

In the exemplary embodiments, the lot 101 may be processed by the fabrication tools 110, 120 in a sequential order. The fabrication tool 110 is, but not limited to, a fabrication tool for performing a process of CMP. As mentioned above, at some fabrication stages, measurements are taken as to monitor the lot 101. Therefore, at a CMP stage performed by the fabrication tool 110, the CMP thickness may be measured and recorded in the SPC chart. The exemplary embodiments are not intended to limit the means for measuring the CMP thickness, the CMP thickness may be measured by using various number of methods including those that would be known in the art.

Next, the lot 101 may be transferred to the fabrication tool 120 for further fabrication processing. In the exemplary embodiments, the fabrication tool 120 is, but not limited to, a fabrication tool performing a process of photolithography. In the photolithography process, various manufacturing steps such as cleaning, photoresist coating, baking, alignment, exposure, inspection, etc. are performed to create a pattern on the lot 101. During the photolithography process, critical dimension may be measured and recorded in the SPC chart. The overlay would also be measured and recorded in the SPC chart. The overlay includes various values that indicates the alignment of the pattern produced by a mask. For example, a misalignment may be represented in x, −x, y and −y values. The exemplary embodiments are not intended to limit the means for measuring the critical dimension and the overlay, these parameters of the wafer indicating the accuracy of the photolithography may be measured by using various number of methods including those that would be known in the art.

In the exemplary embodiments, after the pattern is created on the lot 101 through photolithography process, the lot 101 would be transferred to the first fabrication tool 130-1 for the subsequent fabrication process. The first fabrication tool 130-1 is, for example, a fabrication tool for performing an etching process. In the exemplary embodiment, a predetermined route for processing the lot 101 is designed to dispatch the lot 101 in a sequence of the fabrication tools 110, 120, 130-1. The predetermined route may be planned based on the capability and performance of the fabrication tools, where some fabrication tools hold a greater tolerance or throughput of product than others. However, in the fabrication facility, if fabrication tool stands idle or have too much work waiting for them, the cost of production goes up as the fabrication tool are not being used predeterminedly or the lot is being placed at a holding area waiting for the fabrication tool to finish its current job. However, the throughput may be reduced because a plurality of lots would be held between the fabrication tools 120 and 130-1 waiting for the first fabrication tool 130-1 to complete its process before loading the next lot into the fabrication tool 130-1. In some cases, this may occur due to the limited number of the first fabrication tools 130-1 in the facility, or the prior processes may be completed in a faster rate which results in bottleneck condition before the first fabrication tool 130-1. To maximize throughput of the product and efficiently occupy the fabrication tools on the fabrication floor, the lot 101 may be dispatched to the second fabrication tool 130-2 instead of the first fabrication tool 130-1 according to a release rule. The release rule may be constructed according to the rated performance (or tolerance, or rating) of the second fabrication tool 130-2, where predetermined thresholds for the CMP thickness, critical dimension, and alignment overlay may be configured as at least a portion of the release rule. Taking the alignment overlay as an example, the release rule may include a threshold or tolerance of the measurements in +X, −X, +Y, and —Y coordinates of an alignment mark, where the center of the alignment mark is an origin of the alignment mark. That is, a misalignment value for each of the +X, −X, +Y, and −Y coordinates. For example, +X value would a difference between the alignment mark of two different layers at the +X coordinate, and the values of other coordinates may be deduced from the example above. In other exemplary embodiments, the dispatching of the lot 101 to the second fabrication tool 130-2 also occur even when the first fabrication tool 130-1 is not busy, so that the first fabrication tool 130-1 may be kept available since the next lot may not meet the release rule.

In some embodiments, the first fabrication tool 130-1 is determined to have a better performance than the second fabrication tool 130-2, and therefore, the first fabrication tool 130-1 is scheduled as the predetermined route. For example, as compared to the second fabrication tool 130-2, the first fabrication tool 130-1 may be more acceptable to misalignment of the overlay or errors in critical dimension from the photolithography process due to its accuracy or other superior performance. Taking etching process as an example, the first fabrication tool 130-1 may have a better accuracy on the etching process. Even when the overlay is misaligned in a certain degree, or less satisfying critical dimension, the first fabrication tool 130-1 is still capable of performing the etching process on the lot 101 with sufficient accuracy, where over etching or other etching errors may be controlled. For example, the chemical or the particle utilized by the etching tool may be selected to have higher accuracy, which results in better yield. On the contrary, if a lot having less satisfying critical dimension or overlay is processed by the second fabrication tool 130-2, the resultant pattern may not be within the tolerance of the product.

In the exemplary embodiments, the system 200 may automatically render a decision of alternating the scheduled predetermined route of the lot 101, where the lot 101 is transferred to the second fabrication tool 130-2 instead of the first fabrication tool 130-1 according to inspection data corresponding to the lot 101 and the release rule. In detail, the system 200 determines whether to the inspection data corresponding to the lot 101 satisfies the release rule. If the inspection data satisfies the release rule, for example, the overlay misalignment of the inspection data does not exceed the overlay misalignment specified in the release rule, the system 200 would automatically alter the scheduled predetermined route of the lot 101. In the exemplary embodiment, the release rule may be constructed according to the rated performance (or tolerance) of the second fabrication tool 130-2, where predetermined thresholds for the CMP thickness, critical dimension, and alignment overlay may be configured as at least a portion of the release rule. In other words, the inspection results of the previous processes made by the fabrication tools, e.g., tools 110, 120, are inquired, as to determine whether the lot 101 is in condition for a route reschedule.

In some exemplary embodiments, the system 200 may further include a constraint 270 which is disposed between the fabrication tool 120 and the second fabrication tool 130-2. When determined that the lot 101 is to be transferred to the second fabrication tool 130-2, the system 200 automatically removes or configures any physical or software constraints 270 to allow the lot to be dispatched to the second fabrication tool. The physical constraint 270 may be, for example, a stopper disposed on a track or a path of a lot transferring device (e.g., robotic arm), which physically prevents the lot transferring device from moving beyond that point. The software constraint 270 may be, for example, a parameter, an on/off function, etc.

In the exemplary embodiments, the release rule may be the CMP thickness, the critical dimension and the alignment overlay. As explained previously, insufficient accuracy on the critical dimension or overlay misalignment, as well as the CMP thickness, may produce errors in etching process, where undesired over etching such as undercut may occur. Therefore, the system 200 may check these parameters as to determine whether the lot 101 is fit for the etching process of the second fabrication tool 130-2.

As mentioned above, at each process or fabrication tool, measurements are taken to check the condition of the lot or quality of the fabrication process. For example, the overlay misalignment, critical dimension, CMP thickness, etc. In some exemplary embodiments, at each of the fabrication processes, if the measured inspection data does not satisfy a predetermined value, the system may rework the lot by sending the lot back to the beginning or any stage of the fabrication process.

In some exemplary embodiment, when the system 200 determines the lot 101 does not satisfies the release rule, the system 200 would not reschedule the lot 101 from its predetermined route. In other words, the lot 101 would be transferred to the first fabrication tool 130-1 for the subsequent fabrication process. Alternatively, in some exemplary embodiment, the system 200 may rework the lot 101 by sending the lot back to any of the fabrication process when it is determined that the lot 101 does not satisfies the release rule. For example, if it is determined that the overlay misalignment exceeds the predetermined release rule. That is, the overlay misalignment is exceeds the capability of the second fabrication tool 130-2. The system 200 may send the lot 101 back to the patterning fabrication tool 120 to rework the lot 101. In some exemplary embodiments, this step may also consider the loads of the first fabrication tool 130-1. For example, there may be several patches of lot waiting in line for the first fabrication tool. In such case, it may be more cost effective to rework the lot by sending the lot back to one of the previous fabrication processes instead of waiting for the first fabrication tool.

Figure 3:
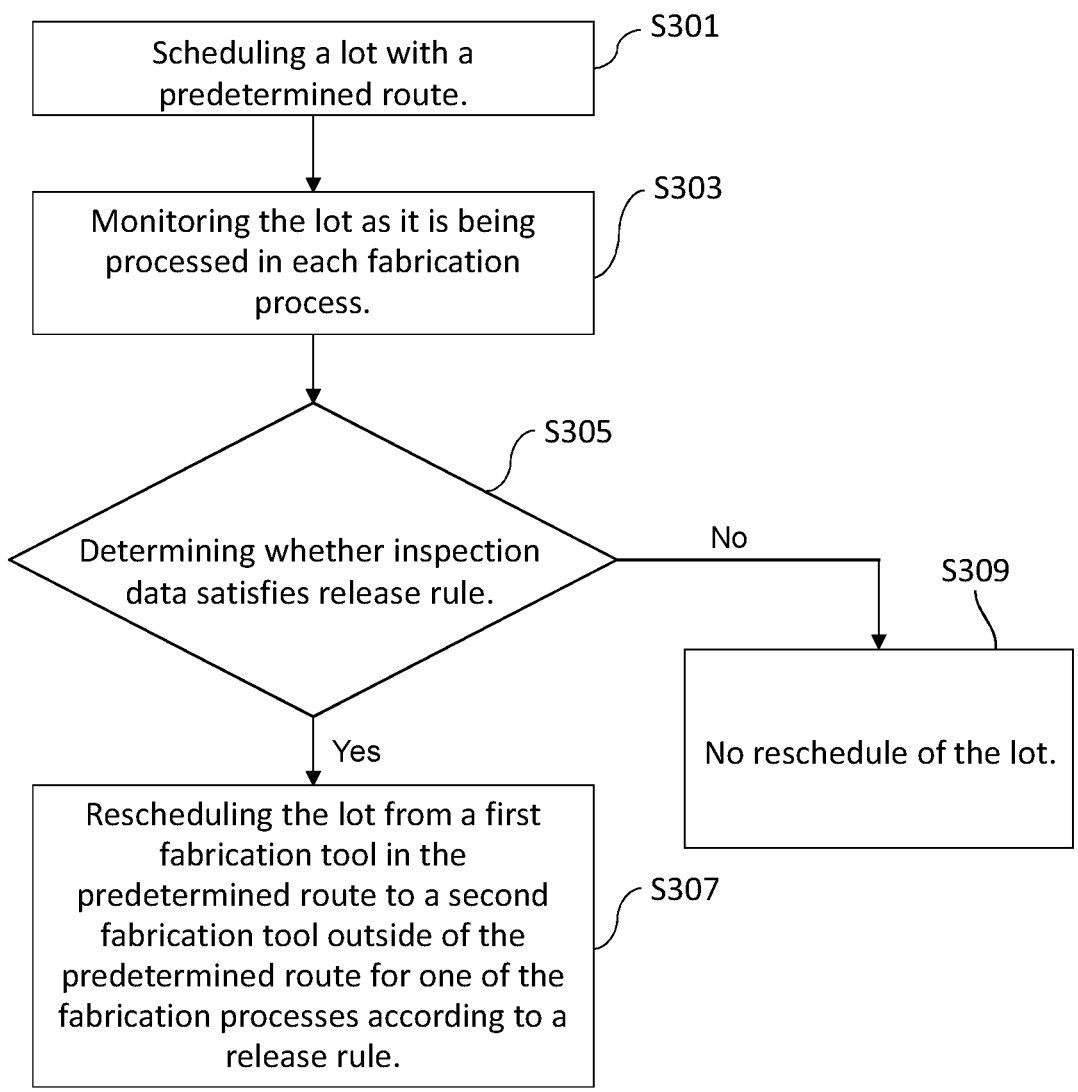
FIG. 3 is a flow diagram illustrating a process of rescheduling a lot according to some of the exemplary embodiments of the disclosure.

FIG. 3 is a flow diagram illustrating a process of rescheduling a lot according to some of the exemplary embodiments of the disclosure. In step S301, the system 200 schedules the lot to a route having a predetermined yield. The scheduled route, also referred to as a predetermined route of the lot, may include a plurality of fabrication tools, where various fabrication processes are to be performed on the lot.

In step S303, the system monitors the lot as it is being processed in corresponding process performed by the corresponding fabrication tool and records inspection data which may represents the result of the corresponding fabrication process. For example, CMP thickness may be measured during the CMP process, and the critical dimension and the alignment overlay may be measured during the photolithography process. The inspection data may be uploaded to the SPC chart through the network.

In step S305, the system would determine whether the inspection data measured from the previous processes satisfies a predetermined release rule. In detail, the inspection data obtained from the previous fabrication processes are compared to the release rule representing the tolerance of the second fabrication tool. Through the inspection data, the system 200 determine whether the lot may be dispatched to the second fabrication tool instead of the first fabrication tool. For example, when the inspection data shows that the overlay misalignment does not exceeds the predetermined release rule, the system would consider that the inspection data satisfies the release rule. The tolerance of the second fabrication tool may be utilized as to configure the release rule beforehand.

In step S307, when it is determined that the inspection data corresponding to the lot satisfies the release rule, the system automatically reschedules the lot. In the predetermined route, the lot is originally scheduled for a first fabrication tool for a fabrication process. Based on the release rule and the condition of the lot (i.e., inspection data), the predetermined route may be altered, where the lot may be dispatched to a second fabrication tool for the same fabrication process instead of the first fabrication tool. As previously described, the first fabrication tool has better performance than the second fabrication tool. In order to dispatch the lot to the second fabrication tool while maintaining good yield, the fabrication processes previously performed on the lot has to be within a certain tolerance. For example, the second fabrication tool may not have sufficient performance (e.g., accuracy) to process the lot that has a certain degree of overlay misalignment, less satisfying critical dimension, etc.

After comparing the inspection values to the release rule, the system alters the predetermined route of the lot by rescheduling the subsequent process to the second fabrication tool instead of the first fabrication tool. The system automatically removes or configures any physical or software constraints to allow the lot to be dispatched to the second fabrication tool. The physical constraint may be, for example, a stopper disposed on a track or a path of a lot transferring device (e.g., robotic arm), which physically prevents the lot transferring device from moving beyond that point. The software constraint may be, for example, a parameter, an on/off function, etc.

In the exemplary embodiments above, the CMP thickness, critical dimension, and overlay alignment are utilized as the release rule for determining whether to dispatch a lot to another fabrication tool or not. However, the disclosure is not limited thereto. In some exemplary embodiments, more or less measurements of a wafer that is being processed prior to a subjected fabrication process (e.g., etching in the embodiments) may be considered. For example, the release rule may only consider the critical dimension of the photolithography process. The reason may be that a second fabrication tool of a subsequent process may be less accurate as compared to a first fabrication tool, where the second fabrication tool may be prone to have undercut. Then, the critical dimension may be an important parameter to consider. Furthermore, the disclosure is not limited to the parameters discussed above. In some exemplary embodiments, other measurements of the processed lot may be included as part of the release rule.

In step S309, when it is determined that the inspection data does not satisfies the predetermined release rule, the system would not reschedule the lot 101 from its predetermined route. In other words, the lot 101 would be transferred to the first fabrication tool for the subsequent fabrication process. In some exemplary embodiment, when it is determined that the inspection data does not satisfies the predetermined release rule, the lot 101 may rework the lot by sending the lot back to any of the fabrication process. For example, if it is determined that the overlay misalignment exceeds the predetermined release rule. That is, the overlay misalignment is exceeds the capability of the second fabrication tool. The system may send the lot back to the photolithography fabrication process (e.g., fabrication tool 120) to rework the lot. In some exemplary embodiments, this step may also consider the loads of the first fabrication tool. For example, there are several patches of lot waiting in line for the first fabrication tool. In such case, it may be more cost effective to rework the lot by sending the lot back to one of the previous fabrication processes.

Furthermore, although the above exemplary embodiments are illustrated by using etching process, the disclosure is not intended to limited thereto. In some exemplary embodiment, the decision making of whether to dispatch a lot to a different fabrication tool of the same process may also be implemented to any fabrication processes (e.g., CMP, deposition, photolithography, etc.)

Figure 4:
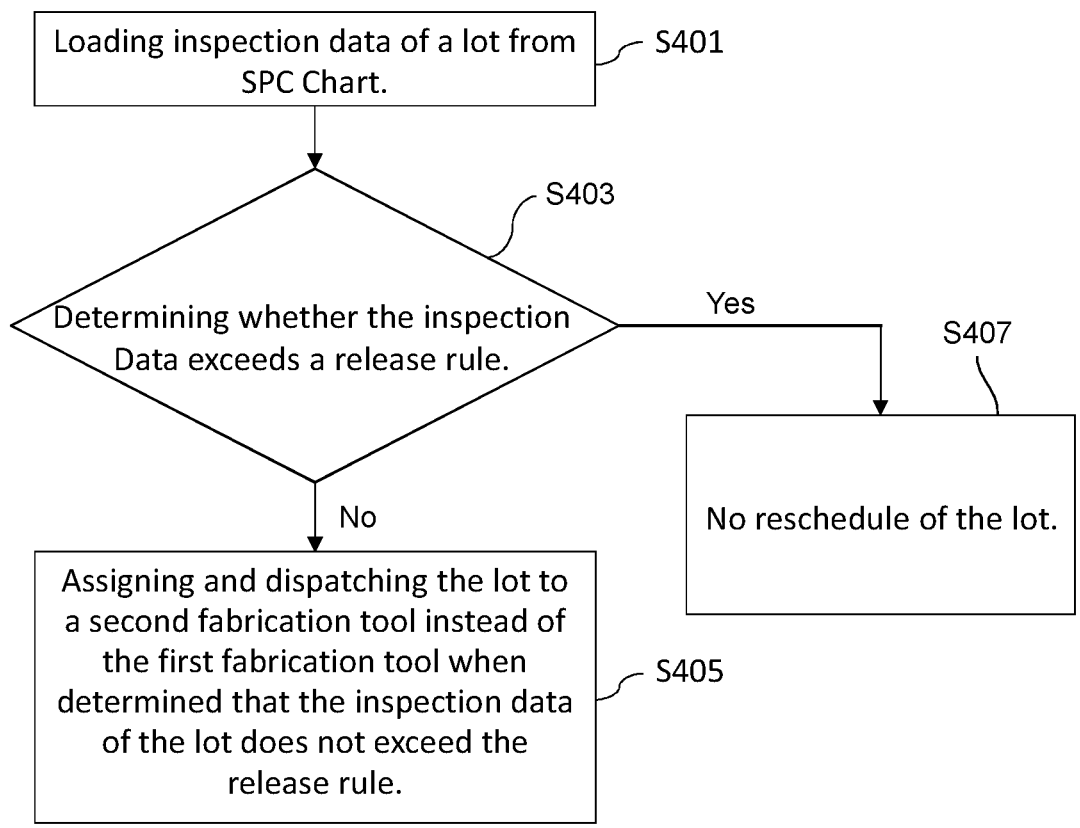
FIG. 4 is a flow diagram illustrating a process of rescheduling a lot according to some of the exemplary embodiments of the disclosure.

FIG. 4 is a flow diagram illustrating a process of rescheduling a lot according to some of the exemplary embodiments of the disclosure. In the exemplary embodiments, it is known that a lot is assigned to be processed by a first fabrication tool for a fabrication process. In step S401, an inspection data corresponding to the previous process performed on the lot is loaded from the SPC chart via network. The inspection data may be measurements on a layer which are obtained from at least one fabrication process prior to the fabrication process that is to be performed by the first fabrication tool. For example, the inspection data may be CMP thickness measured during the CMP process and/or critical dimension and alignment overlay measured during the photolithography process, where the CMP process and the photolithography process forms a layer on the wafers of the lot and were performed prior to the fabrication process that is to be performed by the first fabrication tool.

In step S403, the system determines whether the inspection data exceeds a release rule. The release rule may be predetermined based on the capability of a second fabrication tool which performs the same fabrication process as the first fabrication tool. The inspection data represents the condition of a layer of the wafers of the lot which is formed by at least one previous fabrication process. By comparing the inspection data to the release, the system may determine whether the second fabrication tool has sufficient capability to perform the subsequent fabrication process. If it the inspection data shows that the layer of the wafers of the lot has sufficient accuracy, the system may route the lot to the second fabrication tool as to expand the throughput of the production line.

In step S405, the system automatically assigns and dispatch the lot to the second fabrication tool instead of the first fabrication tool for the fabrication process (e.g., etching process) when determined that the inspection data does not exceed the release rule. On the other hand, if it is determined that the inspection data exceeds the release rule, the system would then dispatch the lot to the first fabrication tool for the fabrication process (e.g., etching process) instead of assigning the lot to the second fabrication tool.

In the above descriptions, a lot is utilized to explain the concept of the disclosure for the purpose of comprehension. However, the disclosure is not limited thereto. The descriptions above are also direct to a batch of wafers divided into a plurality of lots. The determination of whether to automatically reschedule the predetermined route of the lot, or automatically assign or dispatch the lot to a second fabrication tool instead of a first fabrication tool performing the same process, may be expanded to the plurality of lots. In some exemplary embodiments, the determination may be performed by sampling some of the lots within the production line. If the sampled lot complies with the release rule (i.e., not exceeding the thresholds listed in the release rule), a batch of the lots subsequent to the sampled lot may be rescheduled, or assigned and dispatched, to the second fabrication tool.

Figure 5:
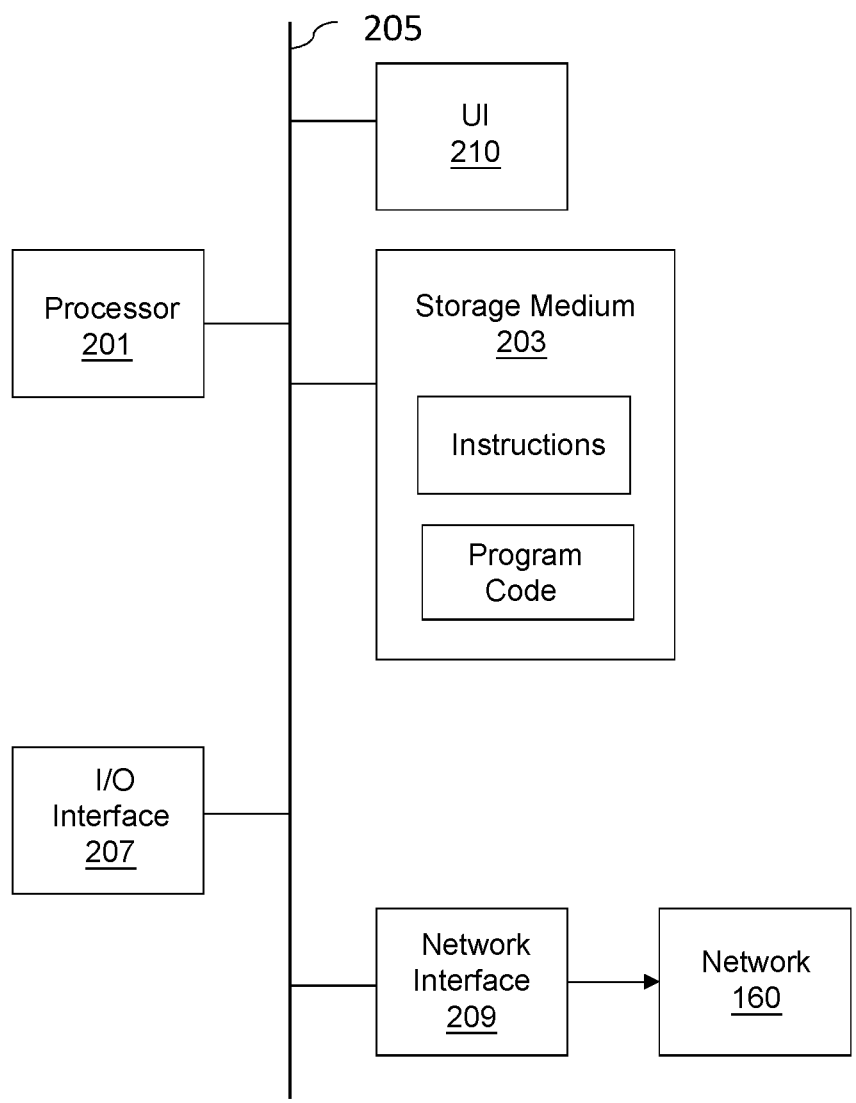
FIG. 5 is a diagram illustrating hardware of a semiconductor fabrication system according to some exemplary embodiments of the disclosure.

The processes illustrated in FIGS. 3 and 4 may be implemented in the server 140, or a computing system that organizes the fabrication of wafer by controlling every or a portion of fabrication tools in the facility. FIG. 5 is a diagram illustrating hardware of a semiconductor fabrication system according to some exemplary embodiments of the disclosure. The system 200 includes one or more hardware processor 201 and a non-transitory computer readable storage medium 203 encoded with, i.e., storing, the program codes (i.e., a set of executable instructions.) The computer readable storage medium 203 may also be encoded with instructions for interfacing with fabrication tools for producing the semiconductor device. The processor 201 is electrically coupled to the computer readable storage medium 203 via a bus 205. The processor 201 is also electrically coupled to an I/O interface 207 by the bus 205. A network interface 209 is also electrically connected to the processor 201 via the bus 205. The network interface is connected to a network, so that the processor 201 and the computer readable storage medium 203 are capable of connecting to external elements via network 160. The processor 201 is configured to execute the computer program code encoded in the computer readable storage medium 205 in order to cause the system 200 to be usable for performing a portion or all of the operations as described in the methods illustrated in FIGS. 3 and 4.

In some exemplary embodiments, the processor 201 is, but not limited to, a central processing unit (CPU), a multi-processor, a distributed processing system, an application specific integrated circuit (ASIC), and/or a suitable processing unit. Various circuits or units are within the contemplated scope of the present disclosure.

In some exemplary embodiments, the computer readable storage medium 203 is, but not limited to, an electronic, magnetic, optical, electromagnetic, infrared, and/or a semiconductor system (or apparatus or device). For example, the computer readable storage medium 203 includes a semiconductor or solid-state memory, a magnetic tape, a removable computer diskette, a random access memory (RAM), a read-only memory (ROM), a rigid magnetic disk, and/or an optical disk. In one or more exemplary embodiments using optical disks, the computer readable storage medium 203 also includes a compact disk-read only memory (CD-ROM), a compact disk-read/write (CD-R/W), and/or a digital video disc (DVD).

In some exemplary embodiments, the storage medium 203 stores the computer program code configured to cause system 300 to perform methods illustrated in FIGS. 3 and 4. In one or more exemplary embodiments, the storage medium 201 also stores information needed for performing the methods illustrated in FIGS. 3 and 4 as well as information generated during performing the methods and/or a set of executable instructions to perform the operation of methods illustrated in FIGS. 3 and 4. In some exemplary embodiments, a user interface 211, e.g., a graphical user interface (GUI), may be provided for a user to operate on the system 200.

In some exemplary embodiments, the storage medium 203 stores instructions for interfacing with external machines. The instructions enable processor 201 to generate instructions readable by the external machines to effectively implement the methods illustrated in FIGS. 3 and 4 during an analysis.

System 200 includes input and output (I/O) interface 207. The I/O interface 207 is coupled to external circuitry. In some exemplary embodiments, the I/O interface 310 includes, but not limited to, a keyboard, keypad, mouse, trackball, track-pad, touch screen, and/or cursor direction keys for communicating information and commands to processor 201.

In some exemplary embodiments, the I/O interface 310 includes a display, such as a cathode ray tube (CRT), liquid crystal display (LCD), a speaker, and so on. For example, the display shows information.

System 200 also includes a network interface 209 coupled to the processor 201. The network interface 209 allows system 200 to communicate with network 160, to which one or more other computer systems are connected. For example, the system 200 may be connected to the fabrication tools 110, 120, 130-1, 130-2 and database 170 through the network interview 209 connecting to the network 160. The network interface 209 includes wireless network interfaces such as BLUETOOTH, WIFI, WIMAX, GPRS, or WCDMA; or wired network interfaces such as ETHERNET, USB, or IEEE-1394.

One of ordinary skill in the art would recognize that an order of operations in the methods illustrated in FIGS. 3 and 4 may be modified. One of ordinary skill in the art would further recognize that additional steps are able to be included in the method 200 without departing from the scope of this description.

According to some exemplary embodiments, a method of rescheduling a lot being processed in a fabrication facility is disclosed. The method includes at least the following steps. The lot is scheduled with a predetermined route having a plurality of fabrication tools configured to process the lot with a plurality of fabrication processes in a sequence. The lot is monitored as the lot is being processed by the fabrication tools in each of the fabrication processes, and inspection data is generated for each fabrication process. The method includes determining whether the inspection data corresponding to the lot satisfies a release rule. The lot is automatically rescheduled to a non-scheduled fabrication tool outside of the predetermined route for a first fabrication process within the fabrication processes according to the release rule and the inspection data.

According to some exemplary embodiments, a method of dispatching a lot assigned to be processed by a first fabrication tool for a fabrication process is disclosed. The method includes at least the following steps. An inspection data corresponding to the lot is loaded from a statistical process control (SPC) chart via a network. Then, it is determined whether the inspection data exceeds a release rule. After determination, the lot is automatically assigned or dispatched to a second fabrication tool instead of the first fabrication tool for the fabrication process when determined that the inspection data does not exceed the release rule.

According to some exemplary embodiments, a system for managing fabrication processes of a lot is disclosed. The system includes at least one memory which stores computer program code for one or more programs and at least one processor. The at least one processor is configured to load the computer program code from the memory which causes the at least one processor to load an inspection data corresponding to a lot that is assigned to be processed by a first fabrication tool for a fabrication process from a statistical process control (SPC) chart via a network, to determine whether the inspection data exceeds a release rule, and to automatically assign and dispatch the lot to a second fabrication tool instead of the first fabrication tool for the fabrication process when determined that the inspection data does not exceed the release rule.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of rescheduling a lot being processed in a fabrication facility, comprising:
   receiving the lot from a load port;
   scheduling the lot with a predetermined route for performing a first fabrication process by using a first fabrication tool and a second fabrication process by using a second fabrication tool in a sequence;
   dispatching the lot to the first fabrication tool for performing the first fabrication process;
   inspecting the lot after the first fabrication process and generating inspection data including a measurement of the lot after the first fabrication process;
   rescheduling and dispatching the lot to a third fabrication tool to perform the second fabrication process in place of the scheduled second fabrication tool to perform the second fabrication process for the first time when determined that the measurement of the lot after the first fabrication process has an error less than a predetermined threshold in the release rule, wherein the second fabrication tool holds higher tolerance with respect to the third fabrication tool; and
   dispatching the lot to the scheduled second fabrication tool for performing the second fabrication process when determined that the measurement of the lot after the first fabrication process has an error greater than a predetermined threshold in the release rule.

2. The method of claim 1, wherein the method further comprises:
   comparing the measurement of the inspection data to the predetermined threshold included in the release rule, wherein the release rule includes rated tolerance of the third fabrication tool.

3. The method of claim 2, wherein the measurement included in the inspection data comprises a chemical mechanical polishing (CMP) thickness measured during a CMP process performed prior to the second fabrication process.

4. The method of claim 2, wherein the measurement included in the inspection data comprises a critical dimension and an alignment overlay measured from a photolithography process performed prior to the second fabrication process.

5. The method of claim 1, wherein the first fabrication process includes a plurality of first fabrication processes prior to the second fabrication process.

6. The method of claim 1, further comprising:
   reconfiguring constraint on a path to the third fabrication tool.

7. The method of claim 1, wherein the lot is rescheduled and dispatched to the third fabrication tool even when the second fabrication tool is free.

8. A method of dispatching a lot, wherein the lot is assigned to be processed by a first fabrication tool for a fabrication process, comprising:
   loading an inspection data corresponding to the lot from a statistical process control (SPC) chart via a network, wherein the inspection data includes a measurement of the lot from at least one fabrication process performed on the lot prior to the fabrication process;
   assigning and dispatching the lot to a second fabrication tool in place of the first fabrication tool to perform the fabrication process when determined that the lot has an error less than a predetermined threshold in the release rule based on the inspection data, wherein the first fabrication tool holds higher tolerance with respect to the second fabrication tool; and
   dispatching the lot to the first fabrication tool to perform the fabrication process when determined that the lot has an error greater than the predetermined threshold in the release rule based on the inspection data.

9. The method of claim 8, further comprising dispatching the lot to the first fabrication tool for the fabrication process when determined that the inspection data exceeds the release rule, wherein the measurement of the lot in the inspection data indicates that the error of the lot is greater than the predetermined threshold in the release rule.

10. The method of claim 8, wherein the first fabrication tool has different tolerance than the second fabrication tool for the fabrication process.

11. The method of claim 8, wherein the inspection data comprises a CMP thickness measured during a CMP process performed prior to the fabrication process.

12. The method of claim 8, wherein the inspection data comprises a critical dimension and an alignment overlay measured from photolithography process performed prior to the fabrication process.

13. The method of claim 8, wherein determining whether the inspection data exceeds the release rule comprises:

determining whether a layer of the lot being formed by at least one previous fabrication process is within a tolerance of the second fabrication tool defined by the release rule.

14. A system, comprising:
at least one memory including computer program code for one or more programs; and
at least one processor, configured to load the computer program code from the at least one memory, wherein the computer program code causes the at least one processor to:
load inspection data corresponding to a lot that is assigned to be processed by a first fabrication tool for a fabrication process from a statistical process control (SPC) chart via a network, wherein the inspection data includes a measurement of the lot from at least one fabrication process performed on the lot prior to the fabrication process;
assign and dispatch the lot to the second fabrication tool in place of the first fabrication tool for the fabrication process when determined that lot has an error less than a predetermined threshold in the release rule based on the inspection data, wherein the first fabrication tool holds higher tolerance with respect to the second fabrication tool; and
dispatching the lot to the first fabrication tool to perform the fabrication process when determined that the lot has an error greater than the predetermined threshold in the release rule based on the inspection data.

15. The system of claim 14, wherein the at least one processor is further configured to dispatch the lot to the first fabrication tool for the fabrication process when determined that the inspection data exceeds the release rule, wherein the measurement of the lot in the inspection data indicates that the error of the lot is greater than the predetermined threshold in the release rule.

16. The system of claim 14, wherein the first fabrication tool has a different tolerance than the second fabrication tool for the fabrication process.

17. The system of claim 14, wherein the inspection data comprises CMP thickness measured during CMP process performed prior to the fabrication process.

18. The system of claim 14, wherein the inspection data comprises critical dimension and alignment overlay measured from photolithography process performed prior to the fabrication process.

19. The system of claim 14, wherein the at least one computer is further configured to determine whether a layer of the lot being formed by at least one previous fabrication process is within a tolerance of the second fabrication tool defined by the release rule.

20. The system of claim 14, wherein the release rule is generated based on the rating of the second fabrication tool.

* * * * *